(12) United States Patent
Horiuchi et al.

(10) Patent No.: US 6,194,668 B1
(45) Date of Patent: Feb. 27, 2001

(54) MULTI-LAYER CIRCUIT BOARD

(75) Inventors: Michio Horiuchi; Yukiharu Takeuchi; Eiji Yoda, all of Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 09/211,806

(22) Filed: Dec. 15, 1998

(30) Foreign Application Priority Data

Dec. 22, 1997 (JP) .................................................. 9-352699

(51) Int. Cl.$^7$ .............................. H01R 12/04; H05K 1/11

(52) U.S. Cl. ............................................ 174/261; 361/792

(58) Field of Search ..................................... 174/255, 261; 361/767, 772, 776, 777, 768, 769, 770, 771, 778, 779, 783, 784, 792

(56) References Cited

U.S. PATENT DOCUMENTS

| | | | |
|---|---|---|---|
| 4,495,377 | * 1/1985 | Johnson et al. ....................... | 174/68.5 |
| 5,220,490 | * 6/1993 | Weigler et al. ....................... | 361/409 |
| 5,379,191 | * 1/1995 | Carey et al. .......................... | 361/777 |
| 5,424,492 | * 6/1995 | Petty et al. ........................... | 174/250 |
| 5,467,252 | 11/1995 | Nomi et al. .......................... | 361/760 |
| 5,901,050 | * 5/1999 | Imai ..................................... | 361/820 |

FOREIGN PATENT DOCUMENTS

| | | |
|---|---|---|
| 0 308 714 | 3/1989 | (EP). |
| 0 883 183 A2 | 12/1998 | (EP). |

OTHER PUBLICATIONS

Abstract of Japanese Patent No. 58090747, published May, 30, 1983.

Dehkordi P. et al. "Determination of Area–Array Bond Pitch For Optimum MCM Systems: A Case Study" Institute of Electrical and Electronics Engineers ISBN, P. 8–12. (Feb. 1997).

Darnauer J. et al. "IELD Programmable Multi–Chip Module (FPMCMN) An Integration of EPGA and MCM Technology", Institute of Electrical and Electronics Engineers ISBN, p.50–55 (Jan. 1995).

* cited by examiner

Primary Examiner—Jayprakash N. Gandhi
Assistant Examiner—Jeremy Norris
(74) Attorney, Agent, or Firm—Pennie & Edmonds LLP

(57) ABSTRACT

A multi-layer circuit board formed by laminating a plurality of circuit boards each having lands arranged in many number in the form of a lattice or in a staggering manner on the side of the mounting surface and having circuit patterns with the ends on one side thereof being connected to said lands and with the ends on the other side thereof being drawn toward the outside from a region where said lands are arranged; wherein the lands for drawing the circuit patterns in a number not less than a+1 are arranged on the oblique lines of an isosceles triangle having a base formed by consecutive lands of a number of n and having oblique lines in the diagonal directions, the value n satisfying $m \geq k+1$ of the two values of:

$$m = \{(\text{land pitch}) \times (n-1) - (\text{land diameter}) - (\text{space between patterns})\} \div (\text{pattern width} + \text{space between patterns}),$$

$$k = a(n-1) + (n-2),$$

wherein "a" is the number of the circuit patterns that can be arranged between the neighboring lands on the circuit board, and "n" is a parameter.

3 Claims, 21 Drawing Sheets

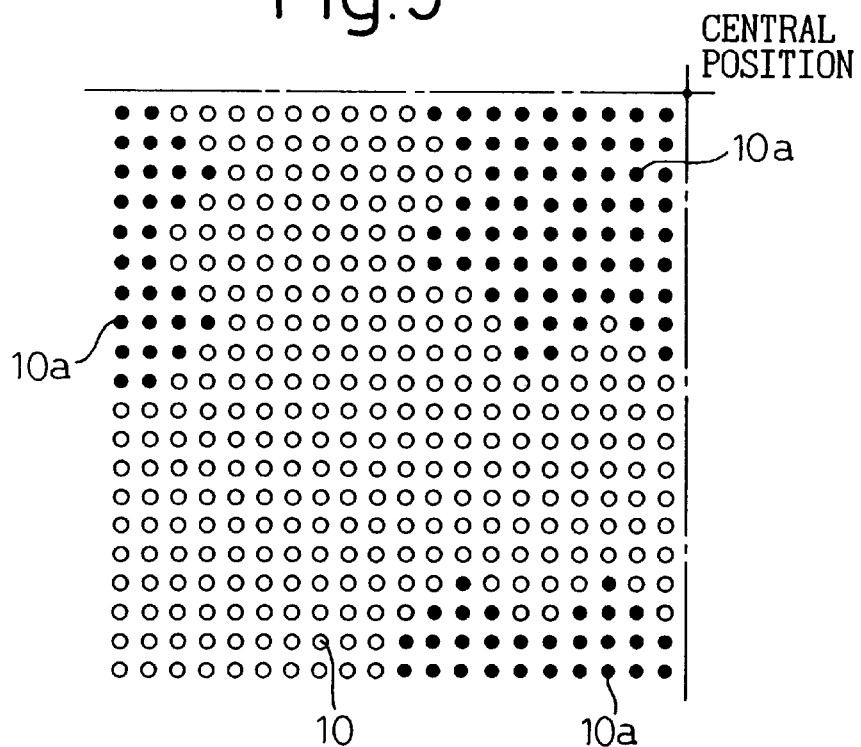
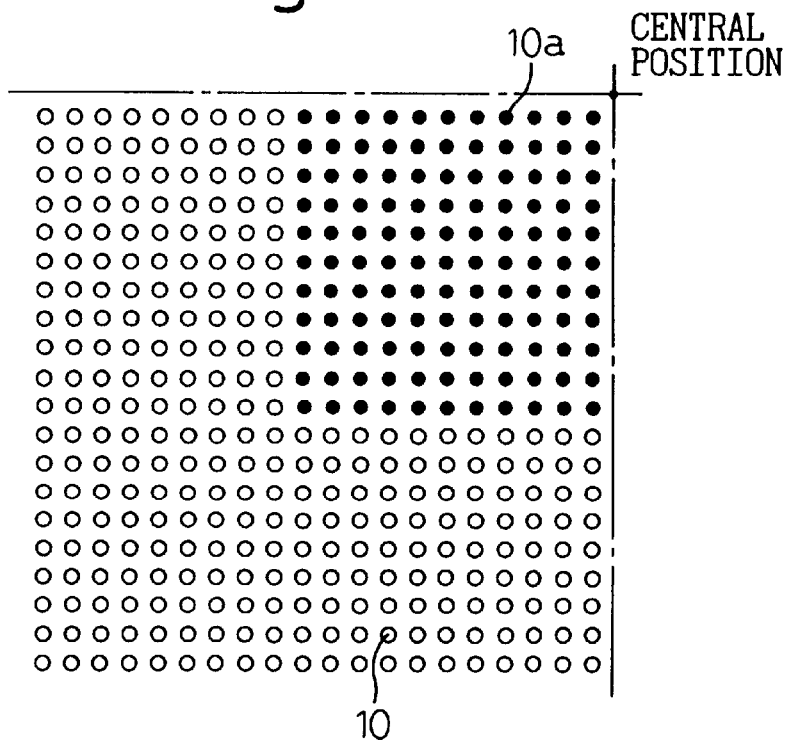

5 5

Fig. 19 - Prior Art
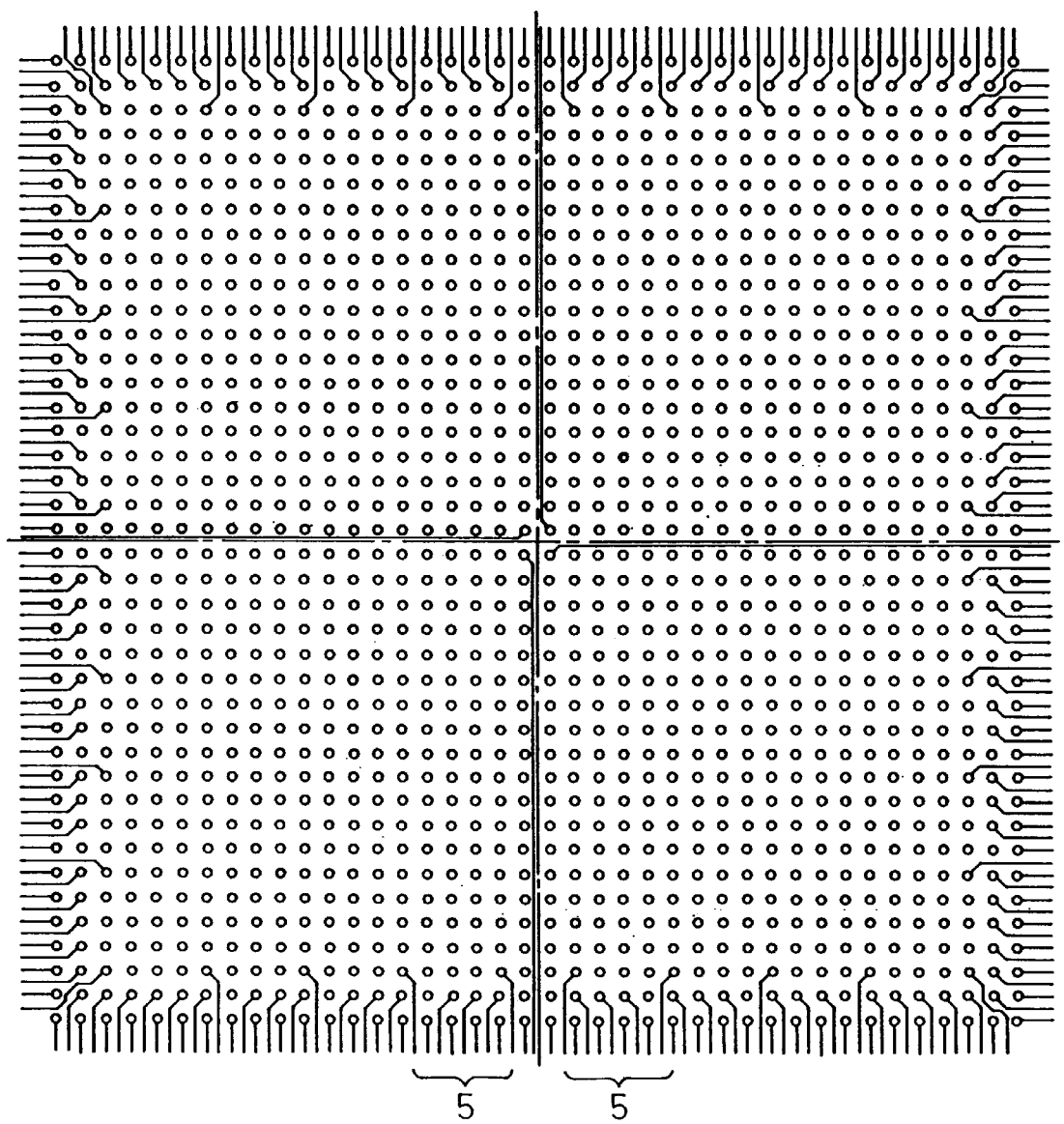

Fig. 20 - Prior Art
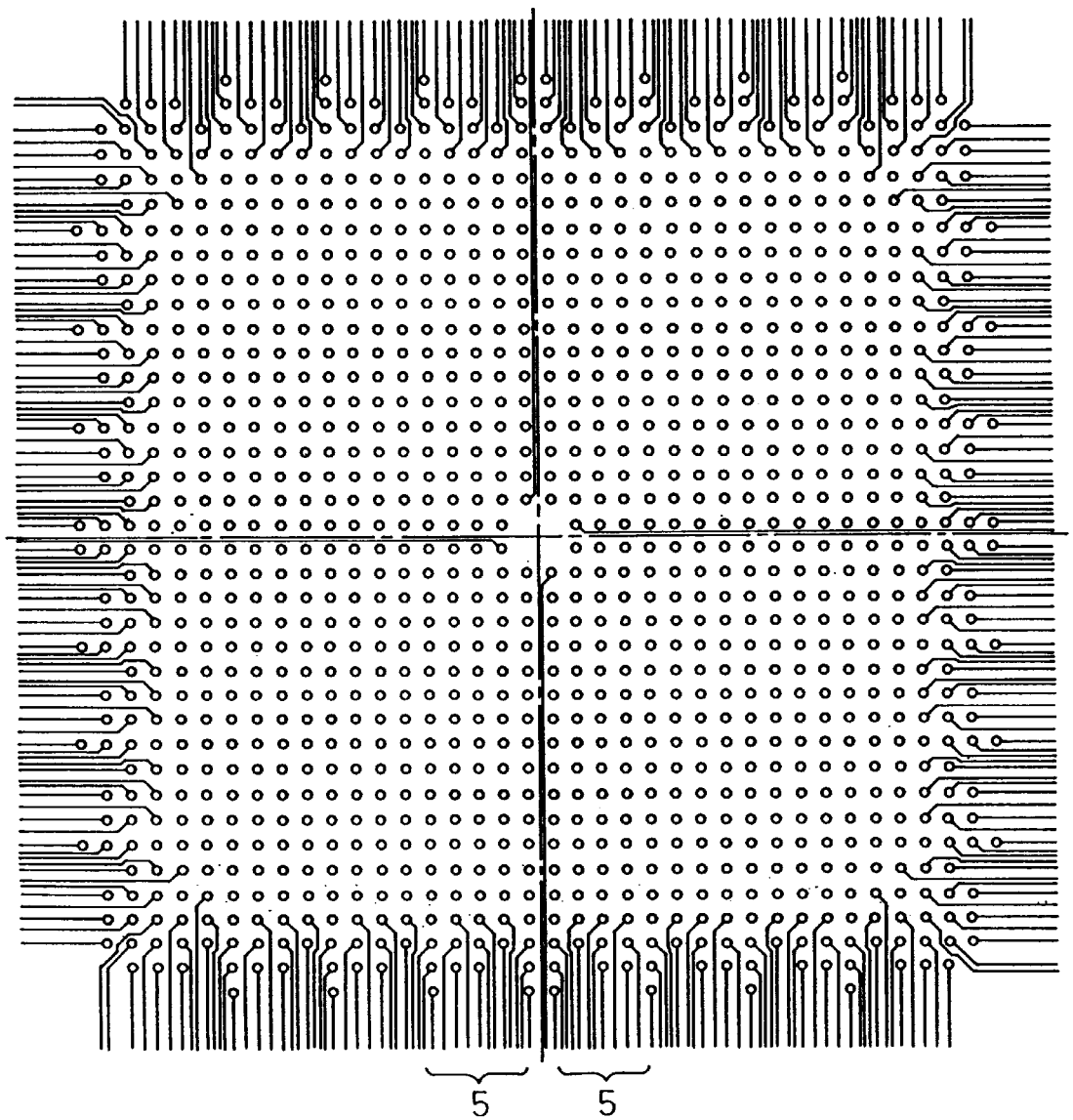
5 5

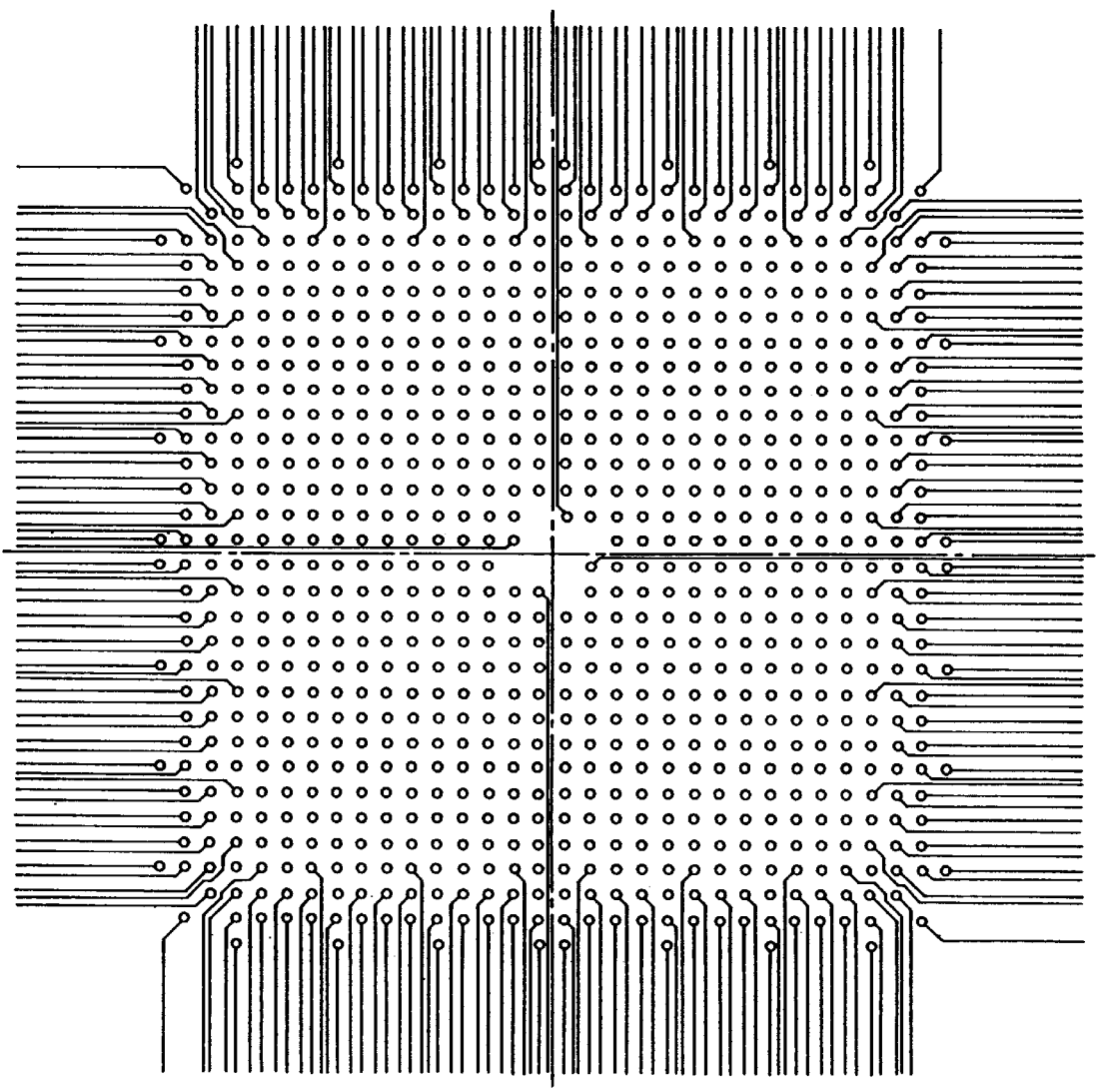
Fig. 21 - Prior Art

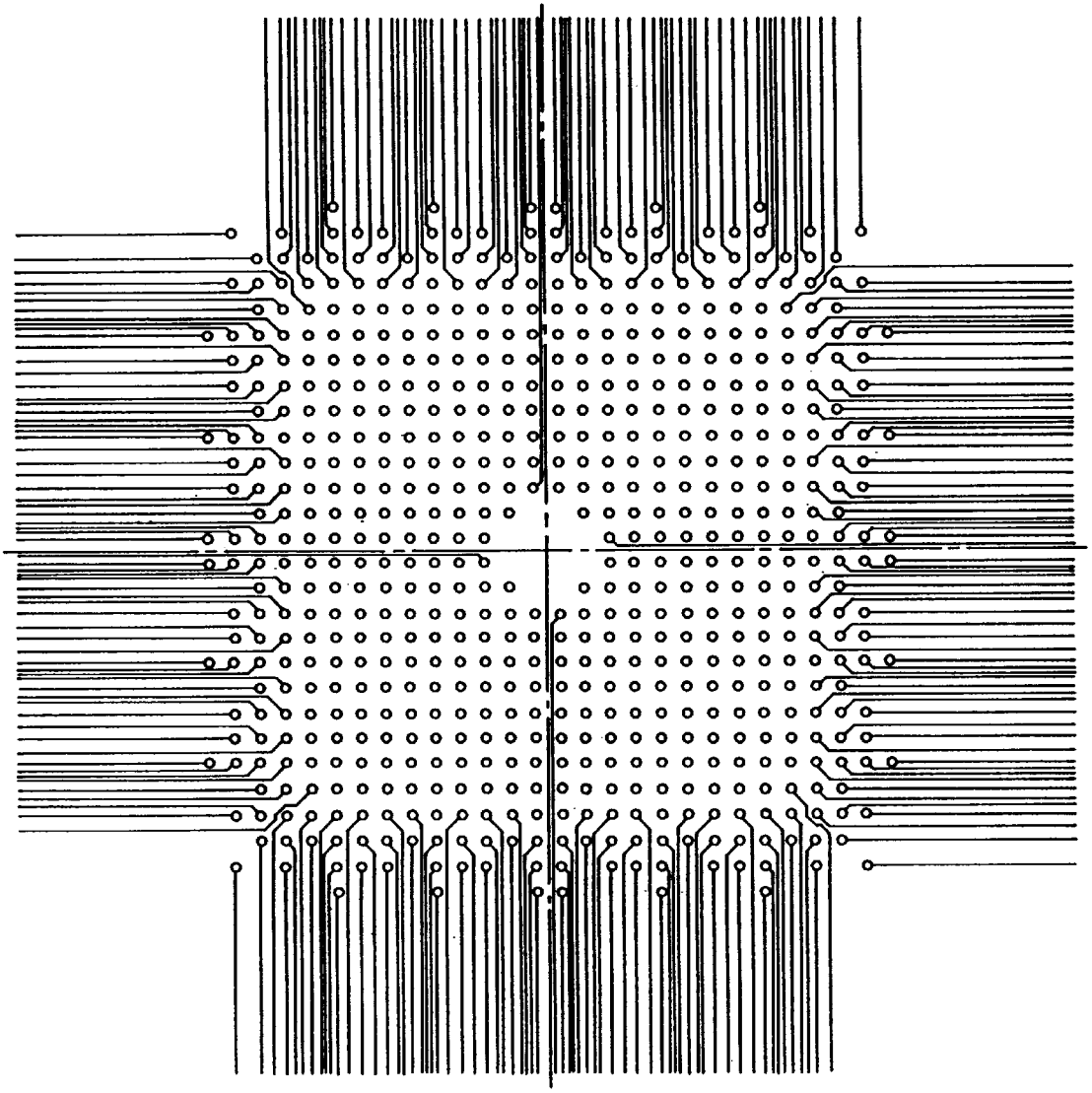
Fig. 22 - Prior Art

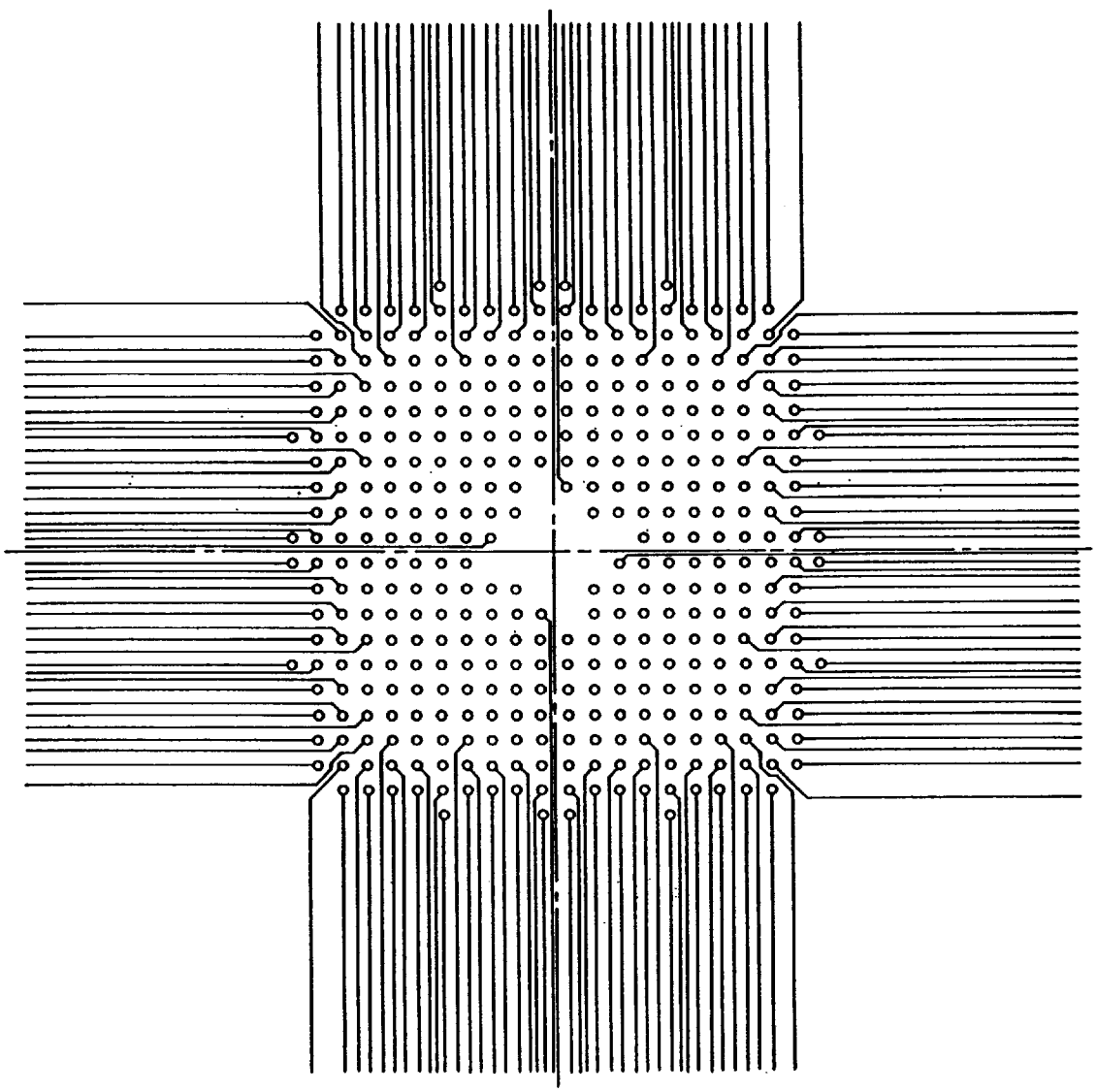
Fig. 23 - Prior Art

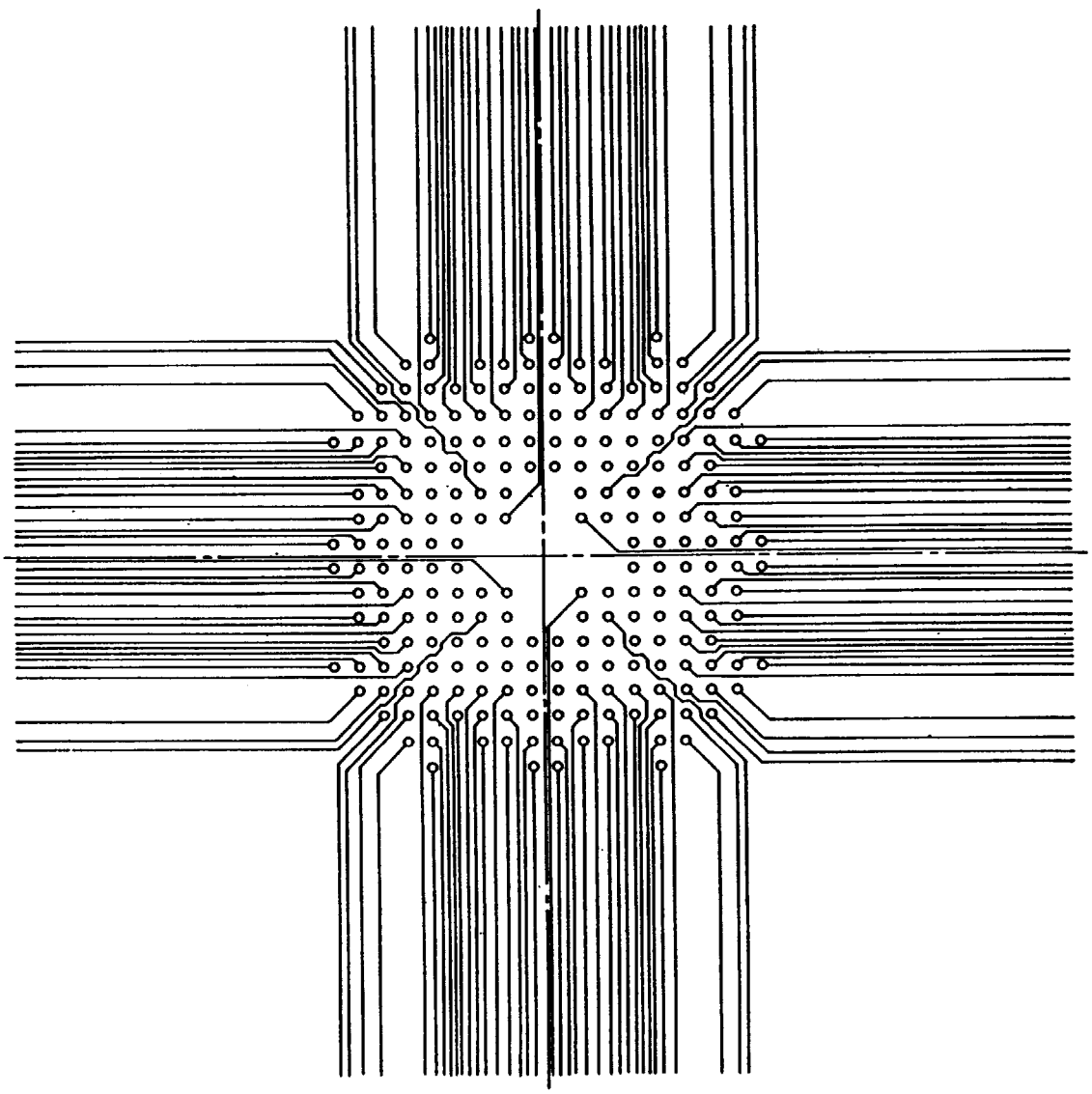
Fig. 24 - Prior Art

Fig. 25 - Prior Art
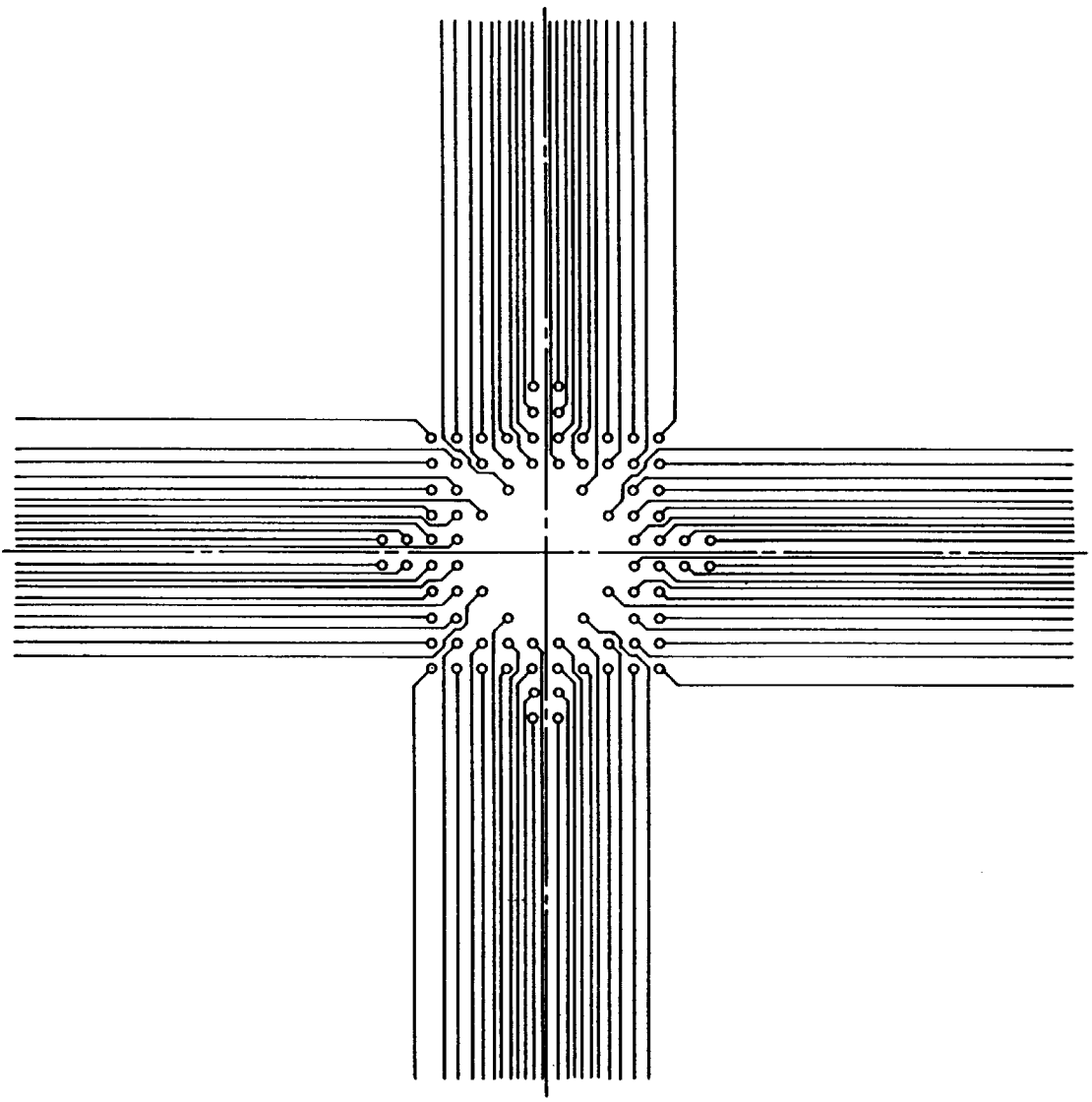
Fig. 26 - Prior Art
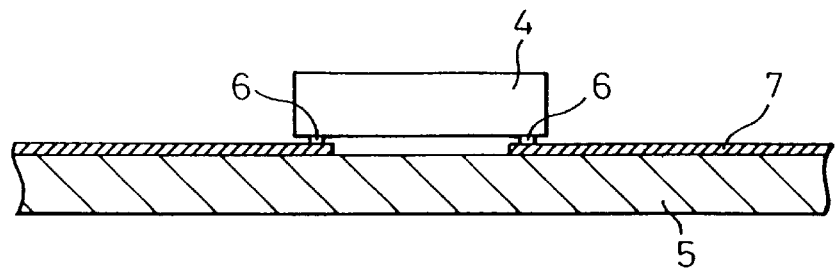

MULTI-LAYER CIRCUIT BOARD

BACKGROUND OF THE INVENTION

1. Field of the Invention

The present invention relates to a multi-layer circuit board for mounting an electronic element such as a semiconductor chip having connection electrodes arranged in the form of a lattice or a semiconductor device having external connection terminals arranged in an area array form.

2. Description of the Related Art

In modern semiconductor devices, the logic devices are becoming highly functional and highly integrated, feature more inputs and outputs, and are being mounted ever more densely. Therefore, products have been produced, to compensate for a lack of space for forming electrodes, by arranging electrodes like a lattice on the electrode-forming surface of a semiconductor chip.

FIG. 26 illustrates an example in which a semiconductor chip 4 is mounted on a circuit board 5 relying on an ordinary flip chip connection. The semiconductor chip 4 has electrodes 6 arranged on the peripheral edges thereof. Circuit patterns 7 are connected to every electrode 6 on a surface.

FIG. 27 illustrates the arrangement of lands 8 and circuit patterns 7 on a circuit board for mounting a semiconductor chip. In this example, the lands 8 are arranged in two sequences, the circuit patterns 7 connected to the lands 8 of the inner side are drawn running among the neighboring lands 8 on the outer side; i.e., the circuit pattern 7 is drawn from every land 8 on a surface.

When the electrodes are arranged in many sequences on the electrode-forming surface, however, it becomes no longer possible to take out the wiring from every land on the surface though it may vary depending upon the distance between the lands and the number of the lands.

In order to solve this problem, a method has been proposed according to which the circuit board for mounting a semiconductor chip is formed in many layers, and circuit patterns are suitably arranged on each of the circuit boards that are laminated to connect all electrodes of the semiconductor chip to the circuit patterns. FIG. 28 illustrates an example where a semiconductor chip 4, on which many electrodes 6 are arranged like a lattice, is mounted on a multi-layer circuit board. By using this multi-layer circuit board, it is possible to electrically connect all electrodes 6 arranged in the form of a lattice to the circuit patterns 7, 7a in order to electrically connect the external connection terminals 9 to the electrodes 6. In FIG. 28, reference numeral 7a denotes a circuit pattern of an inner layer, and reference numerals 5a to 5d denote first to fourth circuit boards.

When the semiconductor chip having electrodes arranged like a lattice is to be mounted on the circuit board, two or more circuit boards may be laminated one upon the other to form a multi-layer circuit board provided that the number of the electrodes is not very large. When the semiconductor chip has as many pins as, for example, 30×30 pins or 40×40 pins, however, six to ten circuit boards must be laminated one upon the other.

When the circuit boards on which the circuit patterns are very densely formed are to be laminated in many layers, there will be employed a high-density wiring method such as build-up method accompanied, however, by serious problems in regard to yield of the products, reliability and the cost of production. That is, when many circuit patterns are to be laminated one upon the other, vias are formed in each board to accomplish an electric connection between the circuit patterns and the circuit patterns across the board, and the boards are successively laminated, requiring a high degree of precision without at present, however, offering a high degree of reliability. When many boards are laminated, furthermore, it is required that none of the boards is defective, involving further increased technical difficulty.

To produce a multi-layer circuit board maintaining a good yield, therefore, a reduction in the number of wiring layers could be an effective solution.

The present invention is concerned with a multi-layer circuit board for mounting an electronic part such as a semiconductor chip having as many as 40×40 pins in the form of a lattice on the side of the mounting surface, or a semiconductor device having electrodes arranged in the form of a lattice on the side of the mounting surface.

SUMMARY OF THE INVENTION

An object of the present invention is to provide a multi-layer circuit board for mounting a semiconductor chip or a semiconductor device, with a reduced number of the circuit boards and, hence, an enhanced production yield of the multi-layer circuit boards, and offering high reliability.

In order to accomplish the above-mentioned object, the present invention is constituted as described below.

That is, the present invention is concerned with a multi-layer circuit board formed by laminating a plurality of circuit boards each having a large number of lands arranged in the form of a lattice or in a staggered manner on the side of the mounting surface and having circuit patterns with the ends on one side thereof being connected to said lands and with the ends on the other side thereof being drawn toward the outside from a region where said lands are arranged; wherein the lands for drawing the circuit patterns in a number of not smaller than a+1 are arranged on the oblique lines of an isosceles triangle having a base formed by consecutive lands of a number of n and having oblique lines in the diagonal directions, the value n satisfying $m \geq k+1$ of the two values of:

$$m = \{(\text{land pitch}) \times (n-1) - (\text{land diameter}) - (\text{space between patterns})\} \div (\text{pattern width} + \text{space between patterns}),$$

$$k = a(n-1) + (n-2),$$

wherein a is the number of the circuit patterns that can be arranged between the neighboring lands on the circuit board, and n is a parameter.

When n is an even number, furthermore, the lands for drawing the circuit patterns are arranged on a figure approximate to an isosceles triangle having the lands of the number of $((n/2)+1)$ arranged on one oblique line thereof.

Furthermore, the circuit patterns are drawn in a number of $k+(n-1)$ or m for the value n.

The present invention relates to a multi-layer circuit board obtained by laminating plural pieces of circuit boards to mount an electronic part such as a semiconductor chip or a semiconductor device having many electrodes, and its object is to constitute a multi-layer circuit board by laminating a decreased number of the circuit boards (wiring layers) by contriving the arrangement of circuit patterns on each circuit board. There is no particular limitation on the method of forming the circuit board in many layers, and any method can be employed such as the build-up method.

The electrodes of an electronic part are usually arranged in the form of a normal lattice or in a staggered manner. Here, what is important is how the circuit patterns be arranged (drawn) in order to efficiently draw the circuit patterns with a least number of the circuit boards in a state where the electrodes are arranged in the form of a normal lattice or in a staggered manner.

The circuit patterns must be drawn to pass among the lands. In practically designing the circuit patterns, therefore, the circuit patterns must be drawn depending upon various conditions such as a pitch between the lands, diameter of the land, width of the pattern, distance between the patterns, etc.

The multi-layer circuit board of the present invention is related to a method of designing the circuit patterns on each circuit board constituting the multi-layer circuit board. The circuit patterns can be efficiently designed on the below-mentioned basis.

In designing the circuit patterns, first, consideration is given to a normal lattice arrangement in which the lands are arranged in the longitudinal and transverse directions maintaining an equal distance.

When the lands are arranged in a number of n maintaining an equal distance, and when the intermediate lands of the number of (n−2) do not exist except the lands at the two extreme ends, then, the number m of the lines that can be passed (arranged) between the lands at the two extreme ends, excluding the lines of the lands at the extreme ends, is given by the formula, m={(land pitch)×(n−1)−(land diameter)−(space between patterns)}÷(pattern width+space between patterns)

where land pitch is a distance between the centers of the lands, land diameter is a diameter of the land, and space between patterns is a minimum distance that must be maintained between the neighboring circuit patterns.

If it is considered that only one circuit pattern is allowed to pass through between the neighboring lands, then, the number k of circuit patterns that can be arranged between the lands at two ends is given by, k=(n−1)+(n−2)=2n−3

This means that there are (n−1) channels that permit the passage of circuit patterns among the lands of a number of n, that there are intermediate lands of a number of (n−2) excluding the lands at both ends, and that a circuit pattern can be drawn from each of these lands.

Upon comparing m with k, therefore, when m=k, there is obtained no effect for increasing the circuit patterns even if the intermediate lands are all removed among the lands of a number of n. When m≧(k+1), on the other hand, there is obtained the effect for increasing the circuit patterns when the intermediate lands are removed.

In order to decrease the number of the circuit boards, therefore, it is recommended to draw as many circuit patterns as possible from a region where the lands are arranged. When m≧(k+1) as described above, the circuit patterns can be drawn in an increased number by removing the intermediate lands except the lands at both extreme ends. Therefore, a value n that gives m≧(k+1) is selected with the integer n as a parameter, and the circuit patterns are arranged according to the value n.

According to this method, the circuit patterns are designed in a manner that the value m is found from the given conditions of a land pitch, land diameter, pattern width, etc., the value m is compared with the value k to find n (integer) which gives m≧(k+1), the sequence of lands of a number (n−2) is removed for the value n, and the circuit patterns are preferentially drawn from the sequence of lands of the number (n−2).

BRIEF DESCRIPTION OF THE DRAWINGS

FIGS. 9 and 10 are diagrams illustrating the arrangement of lands for grounding and lands for wiring on the land region according to the present invention, and the arrangement of lands according to a prior art;

FIGS. 19 to 25 are diagrams illustrating the arrangements of circuit patterns on the first circuit board through up to the seventh circuit board according to the prior art;

FIG. 26 is a diagram illustrating a flip chip connection;

DETAILED DESCRIPTION OF THE INVENTION

Figure 1:
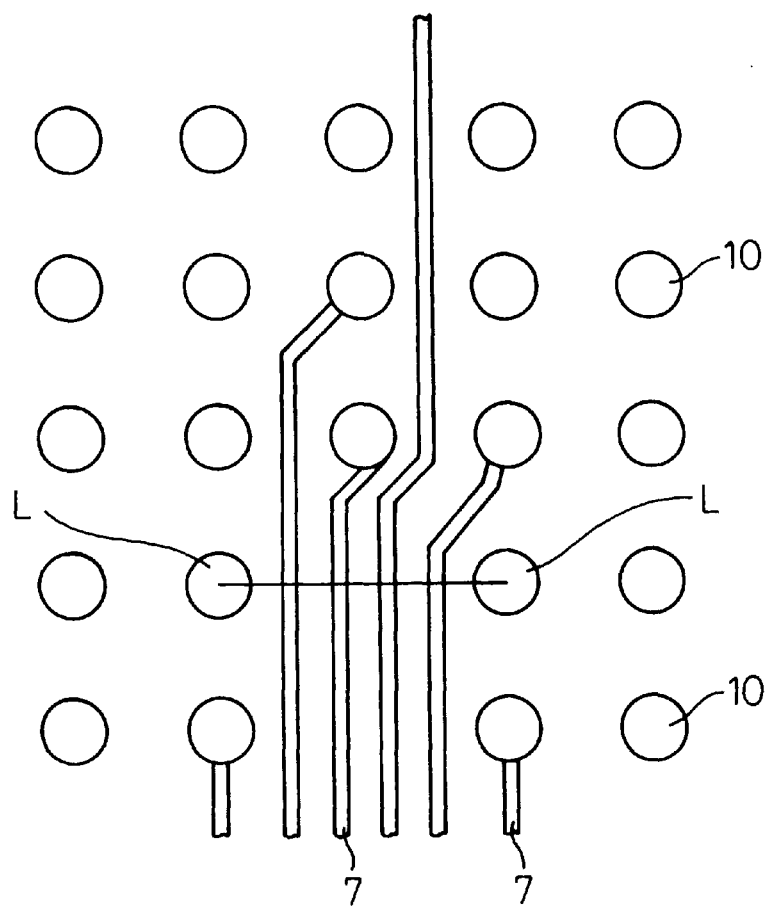
FIG. 1 is a diagram illustrating how to draw the circuit patterns.

FIG. 1 illustrates a case of when n=3 and where the circuit patterns are drawn in an increased number.

In FIG. 1, a distance between L and L is equal to the twice the land pitch. If there is a land 10 between L and L, there can be arranged three circuit patterns including a circuit pattern from an intermediate land and two circuit patterns passing through two land spaces (two channels) defined between the lands on both sides and the intermediate land.

On the other hand, when the land is removed from the space between L and L as shown in FIG. 1 and a circuit pattern is passed through a portion where the land used to exist, then, four circuit patterns can be passed though the space between L and L as shown. That is, the fact that an intermediate land is removed from the three consecutively arranged lands makes it possible to pass one extra circuit pattern compared to when the intermediate land used to exist. It will thus be understood that the circuit patterns are highly efficiently drawn as a result of removing the land from every other land sequence.

In the foregoing was described the case where only one circuit pattern could be passed between the neighboring lands. However, quite the same idea can also be applied to even for a case where the circuit patterns of a number of "a" can be passed through the neighboring lands.

That is, in this case, too, when the lands are arranged in a number of "n" maintaining an equal distance, and when the intermediate lands of the number of (n−2) do not exist except the lands at the two extreme ends, then, the number "m" of the circuit patterns that can be passed through space between the lands at the two extreme ends, is given by, $$m=\{(\text{land pitch})\times(n-1)-(\text{land diameter})-(\text{space between patterns})\}\div(\text{pattern width}+\text{space between patterns})$$

When none of the intermediate lands is removed from a sequence of lands of a number of "n", the number of the circuit patterns that can be arranged between the lands of the two extreme ends is given by, $$k=a(n-1)+(n-2)$$

Therefore, "m" is compared with "k" with "n" as a parameter, a value "n" (integer) that gives $m \geq (k+1)$ is found, and the intermediate lands are removed relying upon the value "n", in order to efficiently draw the circuit patterns.

When it is possible to pass a plurality of circuit patterns between the neighboring lands (through a channel), quite the same idea is applied as that when only one circuit pattern is passed between the lands, in order to efficiently arrange the circuit patterns.

The above-mentioned method of designing circuit patterns is effective in efficiently arranging the circuit patterns by comparing "m" with "k" using "n" as a parameter, finding a value "n" (integer) that gives $m \geq (k+1)$, and removing the intermediate lands according to the value "n". Here, "m" is a number of the circuit patterns that can be passed through the space between the lands at both extreme ends when the intermediate lands are removed from a sequence of "n" lands except the lands at both ends. Usually, therefore, the value "m" increases with an increase in the value "n", and the circuit patterns can be drawn further efficiently.

Figure 2:
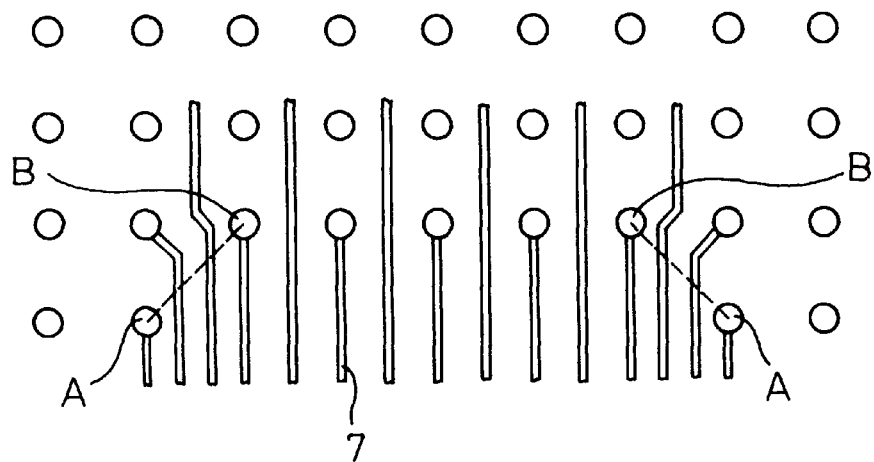
FIG. 2 is a diagram illustrating the drawing of the circuit patterns when n=7.

FIG. 2 illustrates the simplest arrangement of when n=7 and where a circuit pattern can be drawn between the lands. As described above, the value "m" increases with an increase in the value "n". In practice, however, simply increasing the value "m" by increasing "n" is not necessarily an efficient method of designing the circuit patterns.

In FIG. 2, thirteen circuit patterns can be drawn by removing five intermediate lands out of seven lands. This is an increase of only two circuit patterns compared with eleven circuit patterns that are drawn without removing the intermediate lands. Despite the five intermediate lands being removed to provide space wide enough for passing many circuit patterns, the circuit patterns are not really drawn in so large a number due to the limitation on supplying the circuit patterns.

When the circuit patterns are drawn in a state where all the inner lands exist as shown in FIG. 2, what contributes to increasing the number of the circuit patterns that can be drawn are the circuit patterns arranged at both extreme ends in the sequence of the lands. In FIG. 2, two circuit patterns are drawn through the space between the lands A and B. In this case, only the portion where the two circuit patterns are drawn, between the lands A and B, is contributing to increasing the number of the circuit patterns.

As described above, even when the value "n" is so selected that the value "m" becomes as large as possible, the really effective value of "m" is m=k+2; i.e., the circuit patterns are designed by finding a value "n" by which the number of the circuit patterns is decreased by two relative to the number of the circuit patterns that could be drawn without removing the lands.

As described above, furthermore, what most effectively contributes to increasing the number of the circuit patterns that can be drawn, are land portions arranged in the directions of diagonal lines (directions of lines A–B in FIG. 2) at both ends in the sequence of lands. In other words, in selecting the lands for drawing the circuit patterns, it can be said that the circuit patterns are effectively drawn between the lands that are arranged in the directions of diagonal lines.

Figure 3A:
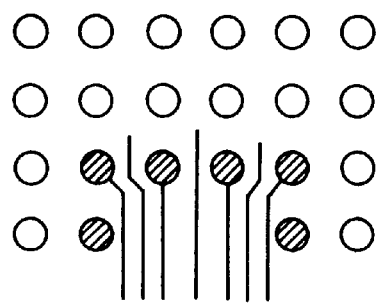
FIGS. 3(*a*), 3(*b*) and 3(*c*) are diagrams illustrating how to draw the circuit patterns when n=4.
Figure 3B:
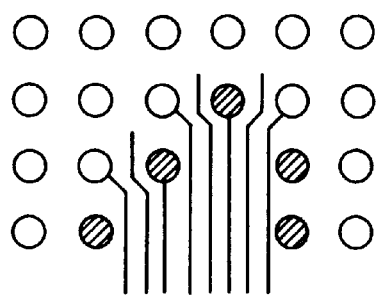
Figure 3C:
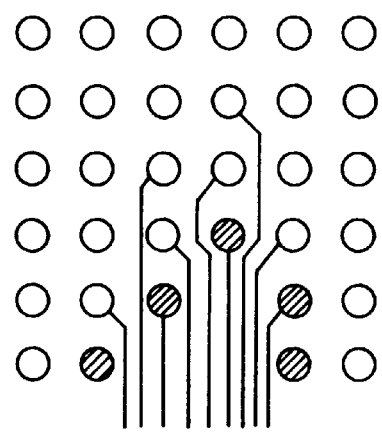

FIGS. 3(a) to 3(c) illustrate a case of drawing the circuit patterns when n=4. FIG. 3(a) illustrates an example in which the circuit patterns are drawn from the lands 10 which are simply arranged as a transverse sequence, and FIGS. 3(b) and 3(c) illustrate examples in which the circuit patterns are selectively drawn from the lands 10 that are arranged along diagonal lines. The conditions for drawing the circuit patterns 7 are determined depending upon the land pitch, land diameter, pattern width, and space between patterns. FIGS. 3(a) to 3(c) illustrate a case where the land pitch is 350 μm and the land diameter is 200 μm, FIGS. 3(a) and 3(b) illustrate a case where the pattern width is 50 μm and space between patterns is 50 μm, and FIG. 3(c) illustrates a case where the pattern width is 43 μm and space between patterns is 43 μm.

In the case of FIG. 3(a) where the lands are simply selected for drawing the wiring patterns, only seven circuit patterns are drawn. In the case of FIG. 3(b) where the circuit patterns are drawn from the lands that are arranged along the diagonal lines, eight circuit patterns can be drawn. In the case of FIG. 3(c), nine circuit patterns can be drawn. That is, the circuit patterns can be effectively drawn from the lands that are arranged along the diagonal lines. The circuit patterns are arranged in different ways between FIG. 3(b) and FIG. 3(c). This is because in the case of FIG. 3(c), more circuit patterns are drawn since the pattern width and space between patterns are smaller than the land diameter and the pitch.

Figure 4A:
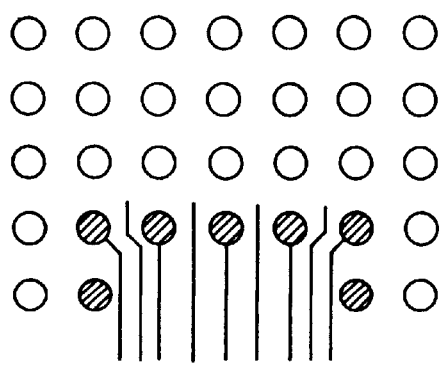
FIGS. 4(*a*) and 4(*b*) are diagrams illustrating how to draw the circuit patterns when n=5.
Figure 4B:
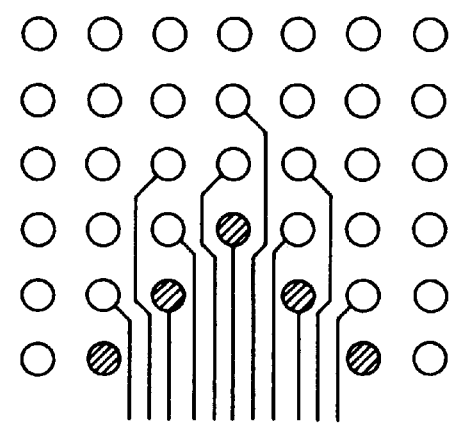

FIGS. 4(a) and 4(b) illustrate a case of drawing the circuit patterns when n=5. In this case, the land pitch is 350 μm, land diameter is 200 μm, pattern width is 50 μm, and space between patterns is 50 μm. FIG. 4(a) illustrates a case where the circuit patterns are simply drawn; i.e., the number of drawing the circuit pattern is increased by one at both ends, and nine circuit patterns are drawn. FIG. 4(b) illustrates a case where the circuit patterns are drawn from the lands arranged along the diagonal lines, and a total of eleven circuit patterns are drawn.

Figure 5A:
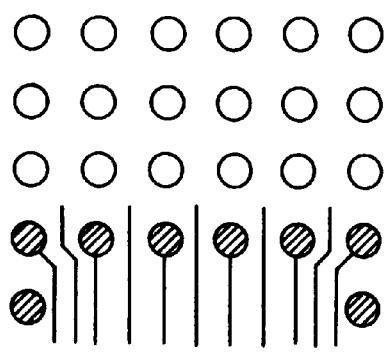
FIGS. 5(*a*), 5(*b*) and 5(*c*) are diagrams illustrating how to draw the circuit patterns when n=6.
Figure 5B:
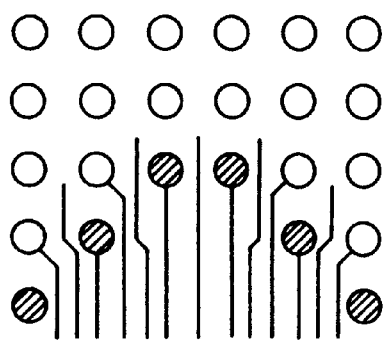
Figure 5C:
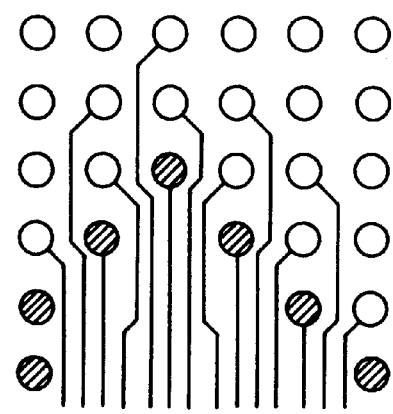

FIGS. 5(a) to 5(c) illustrate a case of drawing the circuit patterns when n=6. In this case, the land pitch is 350 μm, land diameter is 200 μm, pattern width is 50 μm, and space between patterns is 50 μm. FIG. 5(a) illustrates a case where the circuit patterns are simply drawn, i.e., eleven circuit patterns are drawn, FIG. 5(b) illustrates a case where thirteen circuit patterns are drawn due to the arrangement along the diagonal lines up to the third sequence, and FIG. 5(c) illustrates a case where fourteen circuit patterns are drawn due to the arrangement along the diagonal lines up to the fourth sequence.

When FIG. 5(b) is compared with FIG. 5(c), the lands are arranged in the diagonal directions more perfectly in the case of the arrangement of the lands of FIG. 5(c) and, hence, the number of drawing the circuit patterns can be effectively increased. When the lands are to be selected for drawing the circuit patterns, it is desired that the lands are arranged in the diagonal directions as much as possible. In other words, it is desired that the lands for drawing the circuit patterns are located on the sides of an isosceles triangle (base angle of 45 degrees) to maximize the number of pairs of adjacent lands in a diagonal relationship (4 pairs in FIG. 5(b) and 5 pairs in FIG. 5(c)).

Figure 6A:
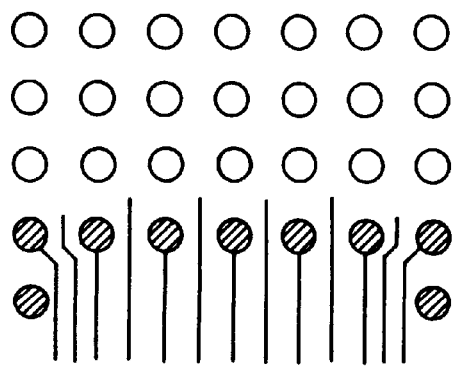
FIGS. 6(*a*) and 6(*b*) are diagrams illustrating how to draw the circuit patterns when n=7.
Figure 6B:
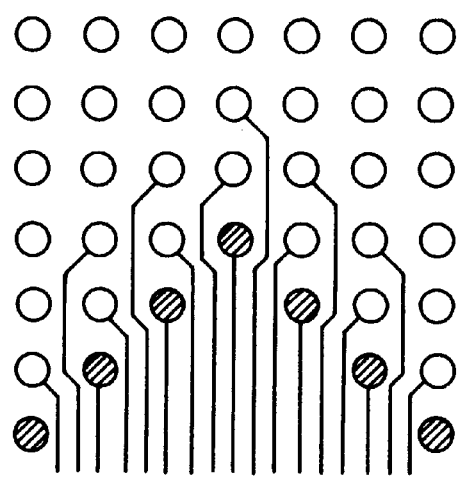

FIGS. 6(a) and 6(b) illustrate a case of drawing the circuit patterns when n=7. In this case, the land pitch is 350 μm, land diameter is 200 μm, pattern width is 50 μm, and space between patterns is 50 μm. FIG. 6(a) illustrates a case where the circuit patterns are simply drawn, i.e., thirteen circuit patterns are drawn, and FIG. 6(b) illustrates a case where the lands for drawing the circuit patterns are arranged along the diagonal lines to draw seventeen circuit patterns.

It will be understood that the circuit patterns can be drawn very efficiently from the lands which are selectively arranged at diagonal angles in the same manner as the one shown in FIG. 5(c). When "n" is an odd number, the lands for drawing the circuit patterns are diagonally arranged on the sides of a complete isosceles triangle, as shown in FIG. 6(b). When "n" is an even number, however, a complete isosceles triangle is not formed. When "n" is an even number, therefore, the vertex should be so selected as to form an arrangement approximating to an isosceles triangle.

As will be understood from the examples of drawing circuit patterns described above with reference to FIGS. 3(a) to 6(b), when the circuit patterns are to be drawn from a region where many lands are arranged in the form of a lattice, it is recommended to design the circuit patterns in such a manner that the lands for drawing the circuit patterns are arranged on the sides of an isosceles triangle having a base angle of 45 degrees having oblique lines in the diagonal directions or on the sides of a triangle approximate thereto.

When such an arrangement is employed, the circuit patterns of a number of "k+(n−1)" can be drawn from the sequence of consecutive lands of the number of "n" under a condition where a single circuit pattern can be passed through the neighboring lands. This is because there are channels of a number of "(n−1)" in the sequence of lands of the number of "n", and a circuit pattern can be drawn from each of these channels when the above-mentioned arrangement is employed.

In practice, the circuit patterns are designed under a variety of conditions such as land pitch, land diameter, pattern width, and number of the lands, and how efficiently the circuit patterns can be drawn varies depending upon the case. It can be said the method of arranging the lands for drawing the circuit patterns along the sides of an isosceles triangle is the most efficient designing method.

The circuit patterns are designed by selecting the value of "n". In this case, however, the value "n" is suitably selected so as to at least satisfy the requirement "m≧k+1", and the lands for drawing the circuit patterns are selected in a manner as described above.

Figure 7:
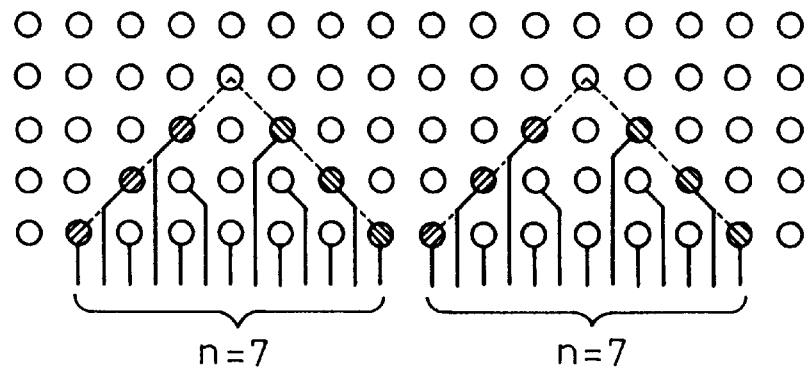
FIG. 7 is a diagram illustrating the drawing of the circuit patterns on a first circuit board when n=7.

In designing the circuit patterns, however, it is not always allowed to arrange the lands for drawing the circuit patterns along the sides of a complete isosceles triangle starting from the first circuit board. FIG. 7 illustrates a case of designing the circuit pattern on the first circuit board when "n=7". As shown, when the arrangement of a complete isosceles triangular shape is not accomplished on the first circuit board, the lands for drawing the circuit patterns are selected to be arranged in an isosceles triangular shape on the next circuit board or on the circuit board after the next circuit board.

Figure 8A:
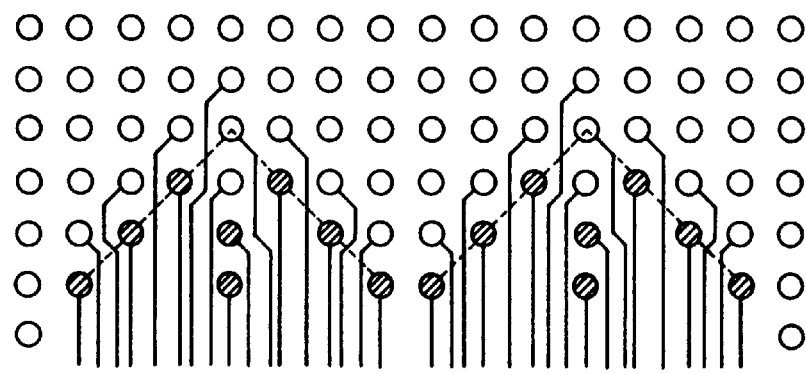
FIGS. 8(*a*) and 8(*b*) are diagrams illustrating the drawings of the circuit patterns on a second circuit board and on a third circuit board when n=7.
Figure 8B:
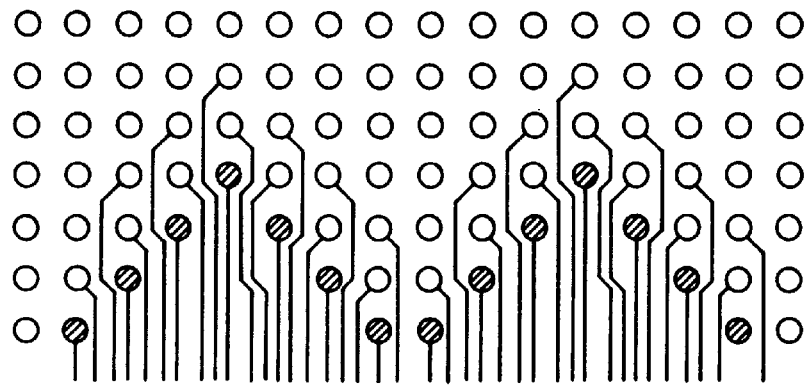

FIG. 8(a) illustrates a circuit pattern on the second circuit board when "n=7" and when the lands for drawing the circuit patterns are selected according to the above-mentioned method, and FIG. 8(b) illustrates a circuit pattern on the third circuit board. In this case, the lands for drawing the circuit patterns are arranged on the sides of an isosceles triangle on the third circuit board.

When the circuit patterns are to be drawn from the lands arranged along the sides of an isosceles triangle as described above, the designing method can be effectively utilized by contriving an arrangement of a zig-zag form as shown in FIG. 9, to arrange the lands from which the circuit patterns must be drawn and to arrange the lands 10a for grounding or for a power source from which the circuit patterns need not be drawn in the region where the lands are arranged in the form of a lattice.

FIG. 10 illustrates an ordinary arrangement of lands in which the lands 10a for grounding or for a power source are arranged in the central portion of the land region. Since the circuit patterns cannot be easily drawn from the central portion of the land region, the lands for grounding or for power source are arranged in a group in the central portion. In the example shown in FIG. 9, on the other hand, the lands 10a for grounding or for a power source are arranged in the central portion and in the outer peripheral portion of the land region, the lands 10a for grounding or for a power source in the outer peripheral portion of the land region being arranged in a zig-zag form (in a triangular shape) as shown, so that the lands 10 for drawing the circuit patterns are arranged at the diagonal positions (along the sides of an isosceles triangle).

With the lands 10 for drawing the circuit patterns being arranged in a zig-zag form, it is possible to draw the circuit patterns according to the above-mentioned method starting from the first circuit board, and the circuit patterns as a whole can be drawn very efficiently. FIGS. 9 and 10 illustrate a quarter of the whole land region. In FIG. 9, the lands 10a for grounding or for power source are not arranged near the corners of the land region. This is because the circuit patterns can be easily drawn from the lands at the corners and, hence, the lands 10a for grounding or for a power source are not arranged at the corners.

Figure 11:
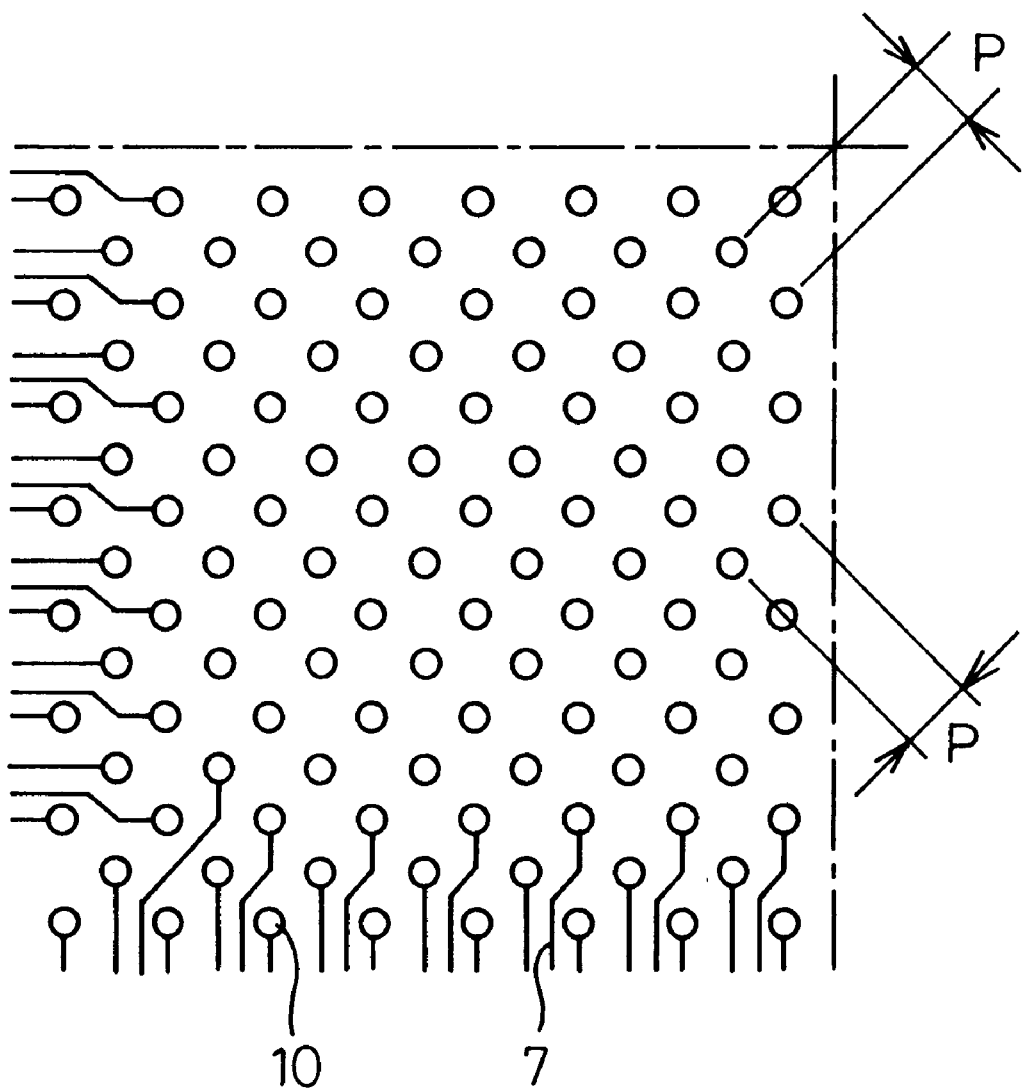
FIG. 11 is a diagram illustrating the lands arranged in a staggered manner.
Figure 12:
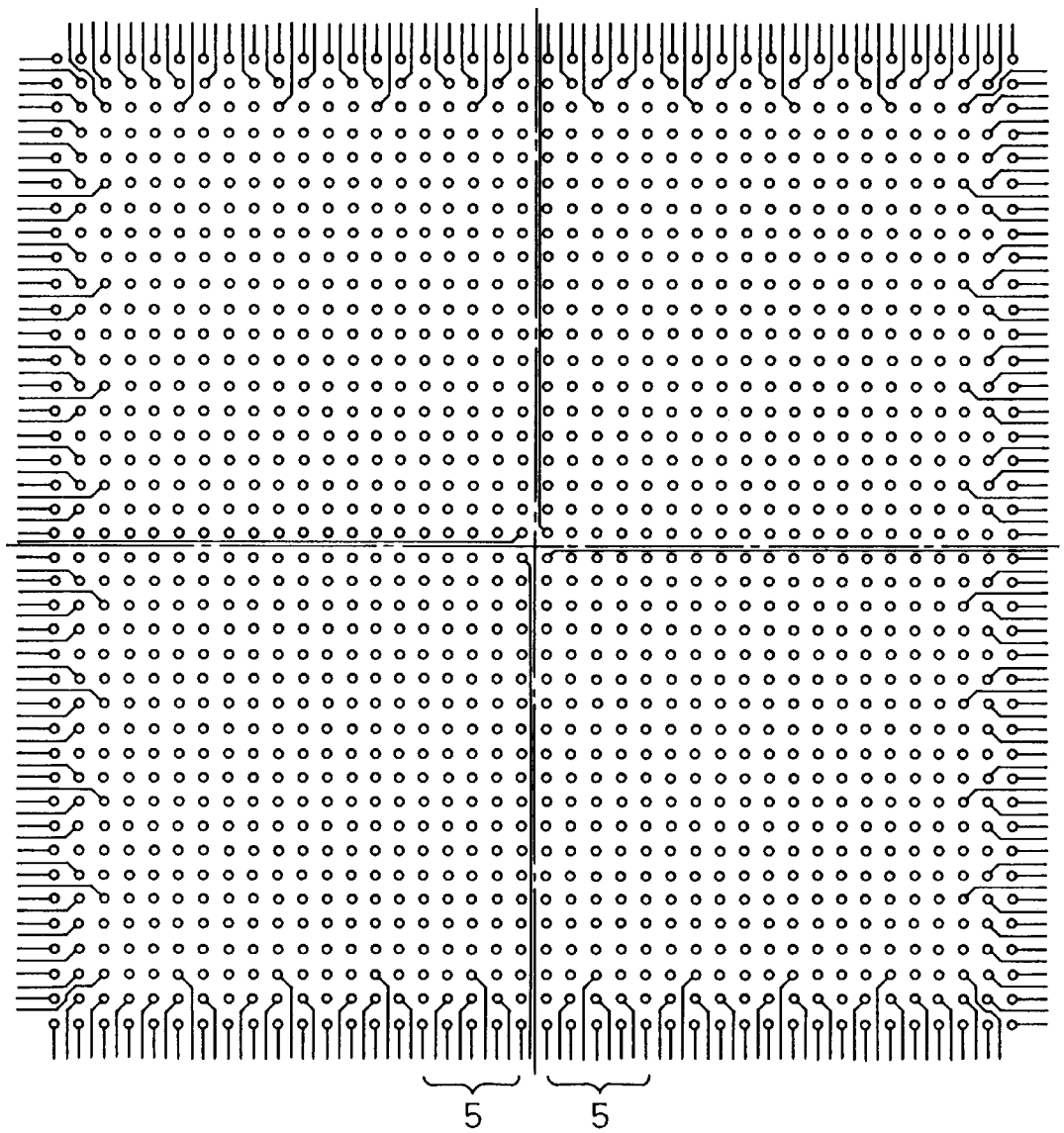
FIGS. 12 to 18 are diagrams illustrating the arrangements of circuit patterns on the first circuit board through up to the seventh circuit board according to a embodiment of the invention.
Figure 13:
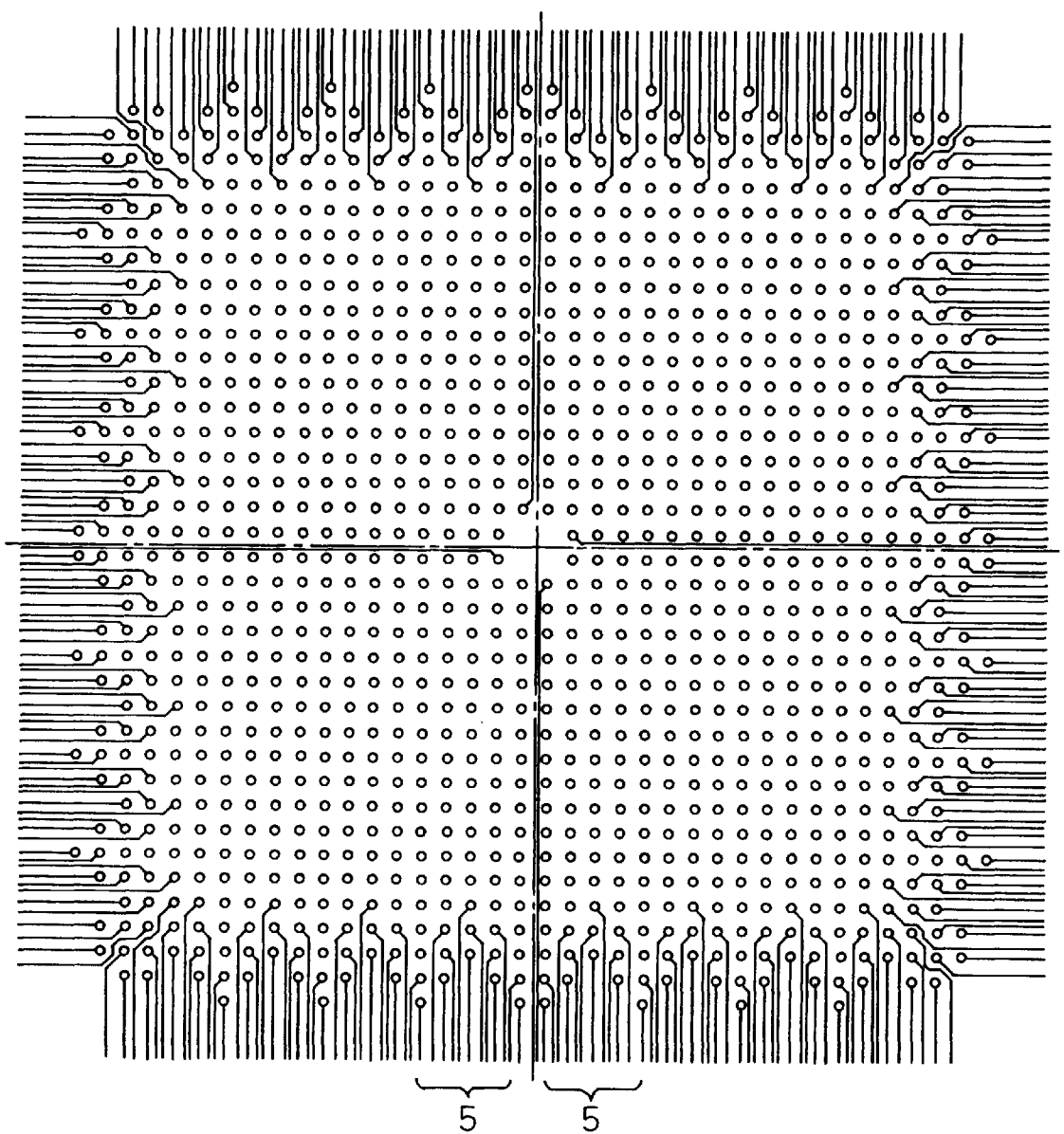
Figure 14:
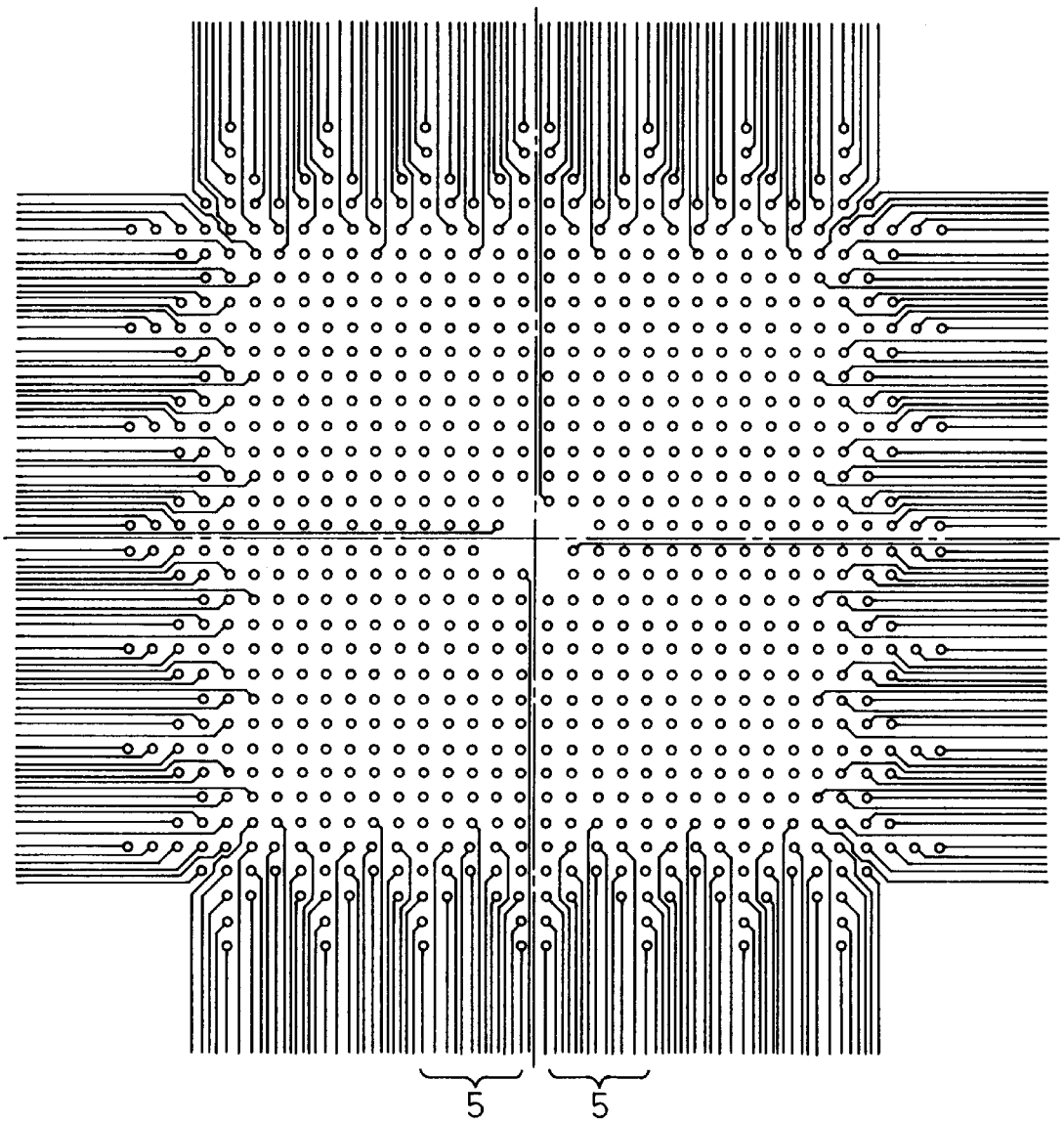
Figure 15:
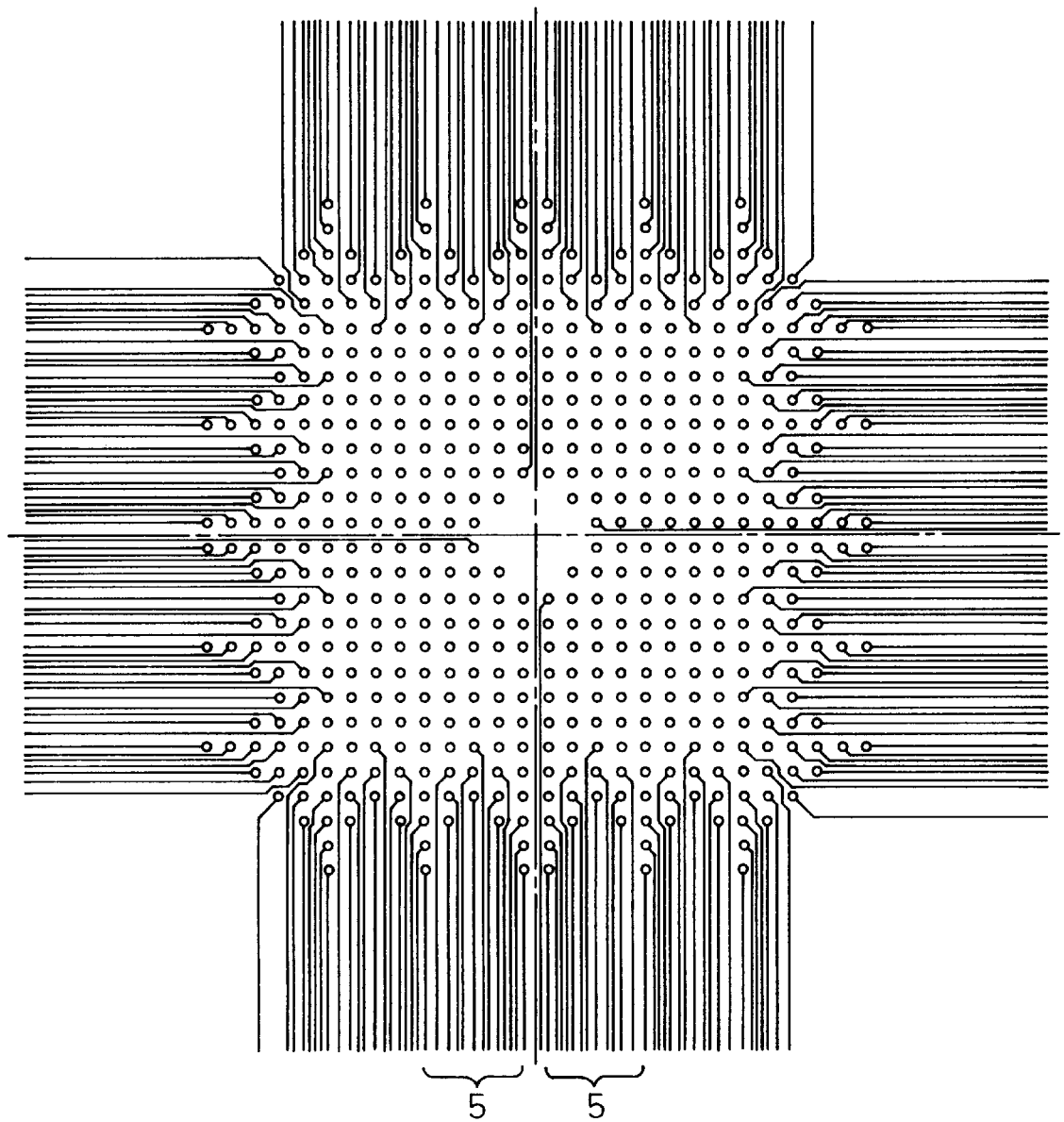
Figure 16:
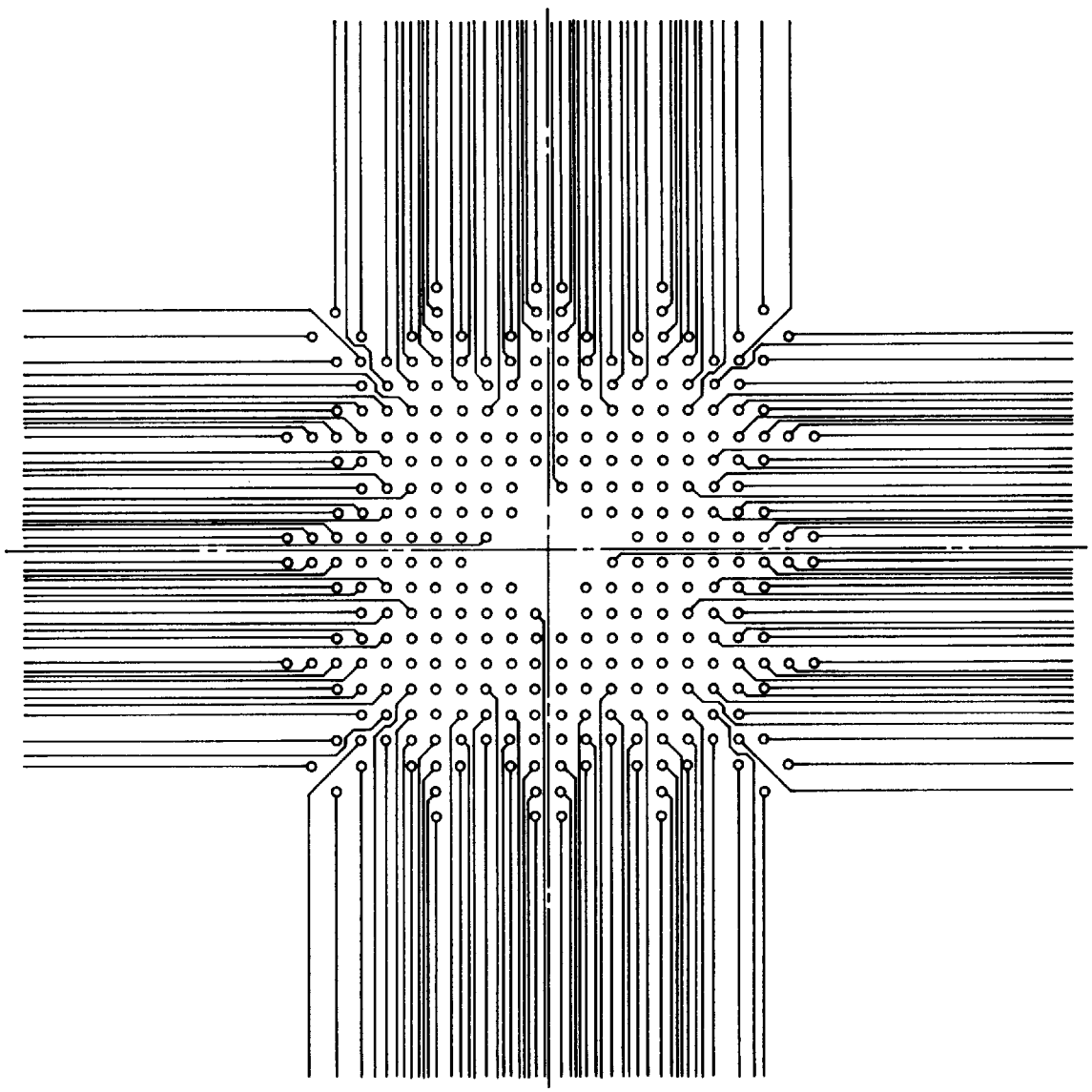
Figure 17:
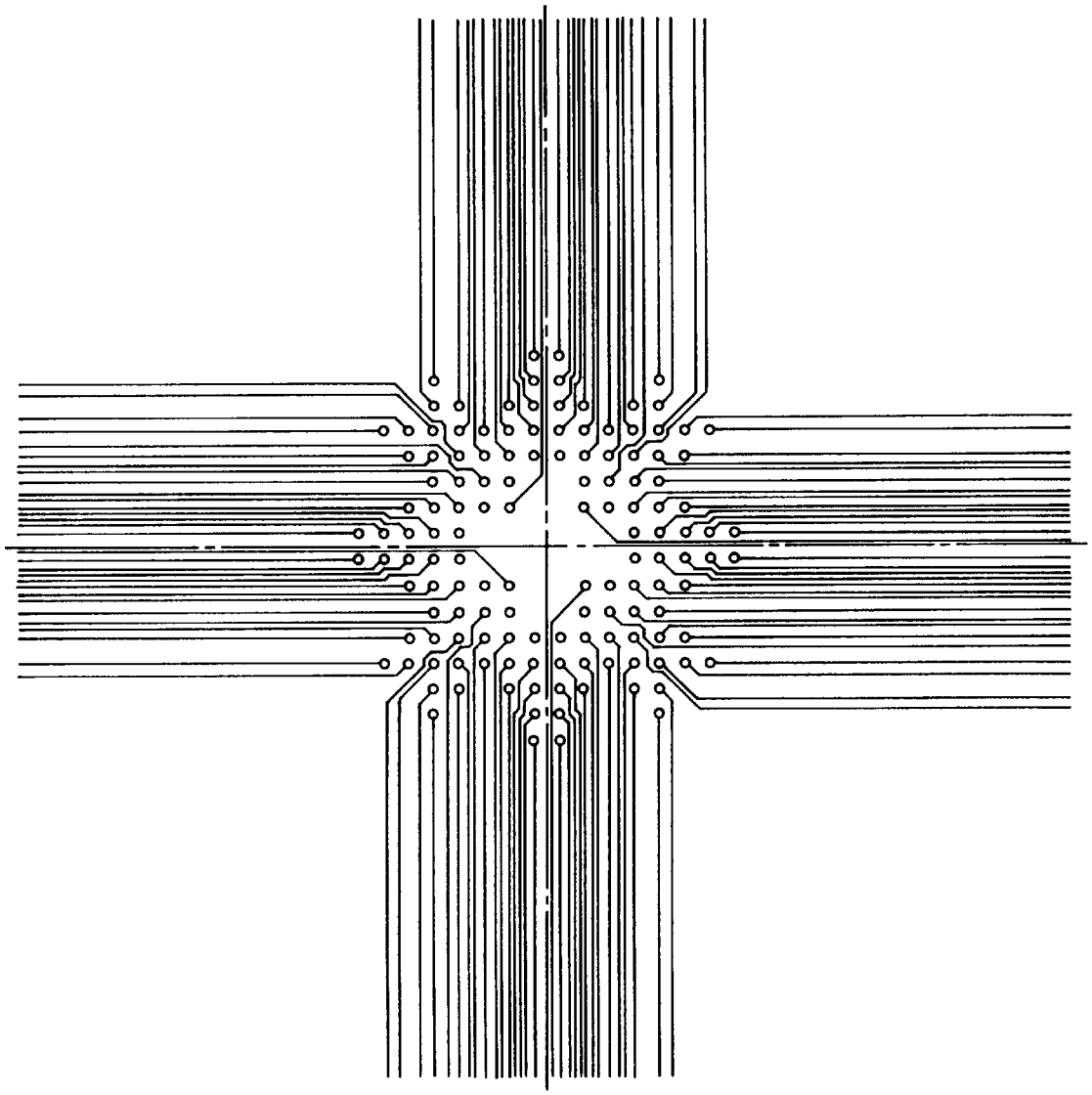
Figure 18:
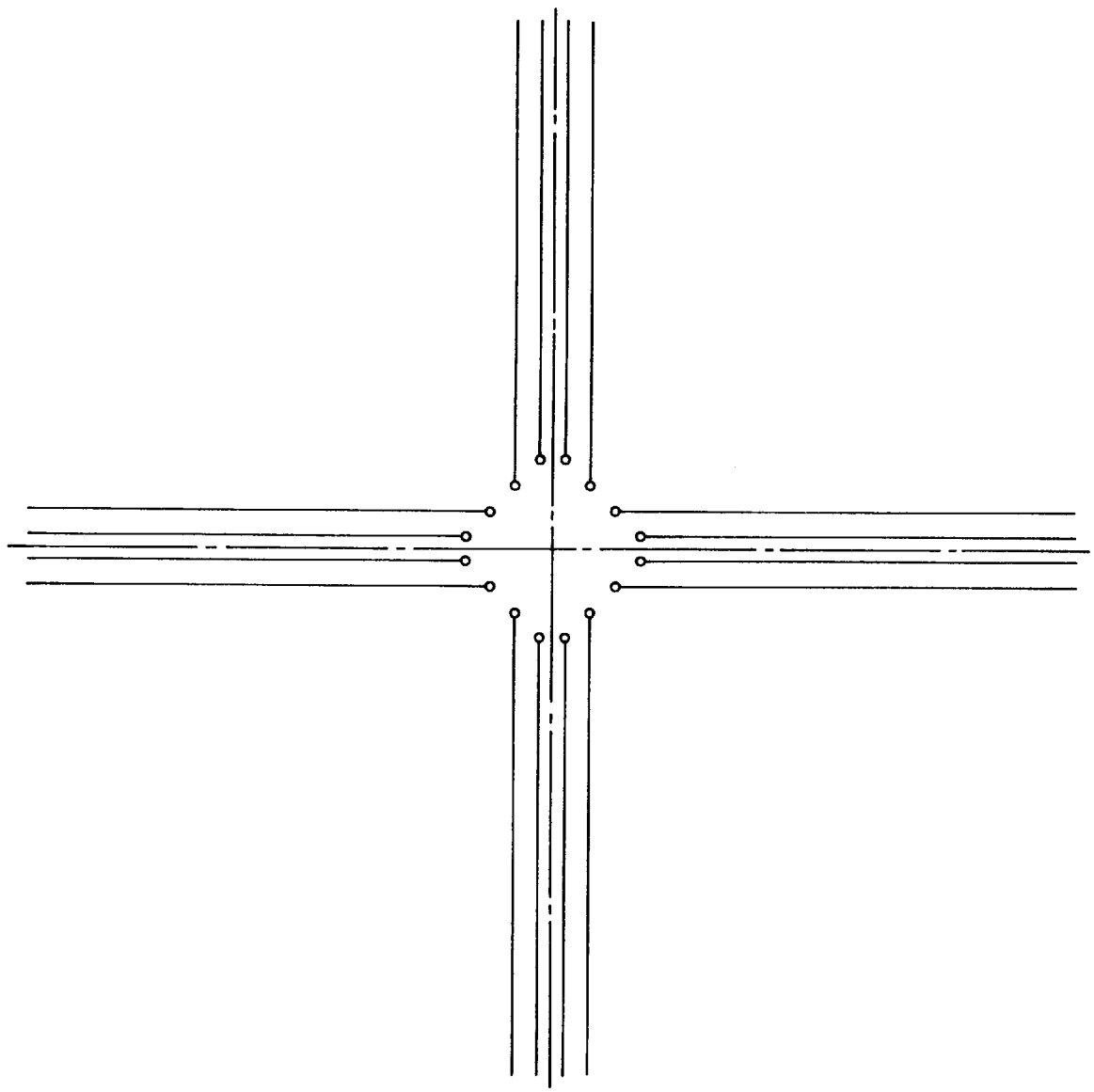
Figure 27:
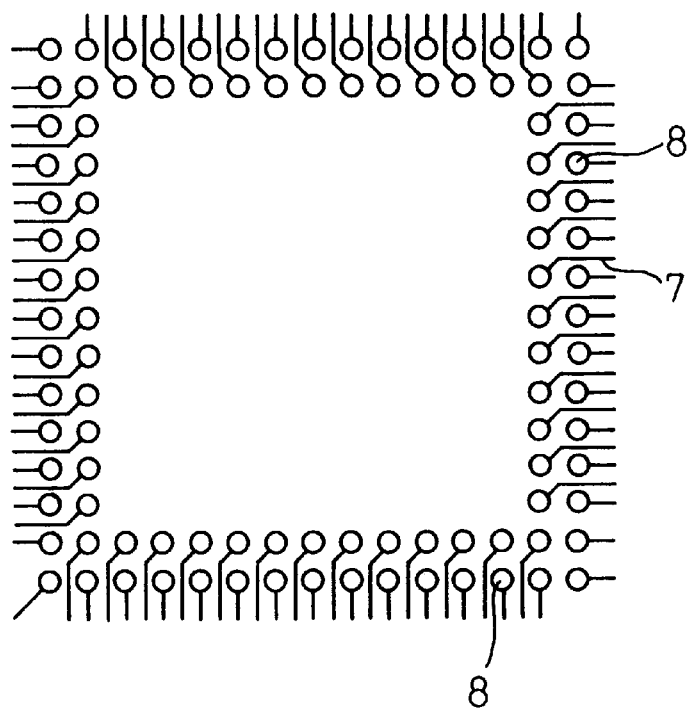
FIG. 27 is a diagram illustrating how to draw the circuit patterns from the outer peripheral side of the land according to the prior art.
Figure 28:
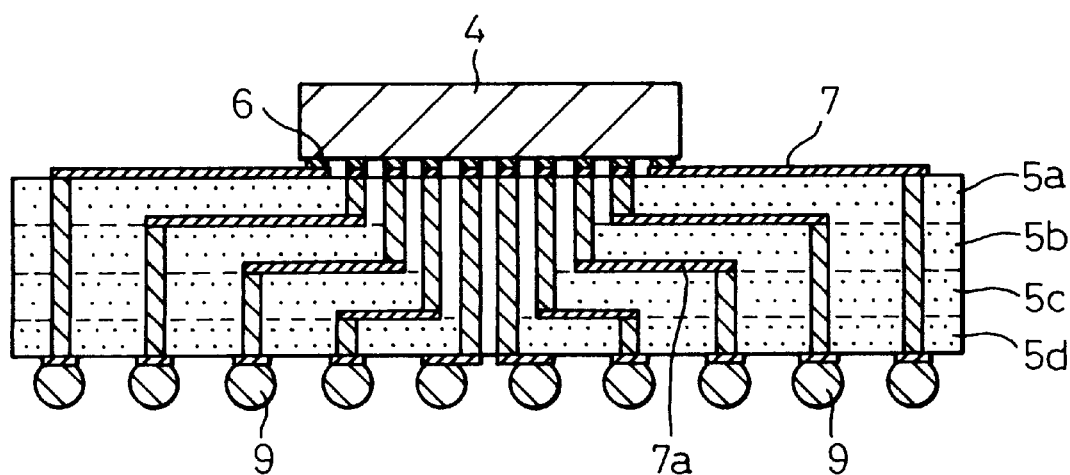
FIG. 28 is a diagram illustrating a multi-layer circuit board on which a semiconductor chip is mounted according to the prior art.

The foregoing description has dealt with the case where the lands are arranged in the form of a normal lattice. The above-mentioned idea for designing the circuit patterns can be applied to the case where the lands are arranged in a staggered manner, too. That is, a staggered arrangement shown in FIG. 11 can be regarded to be the arrangement of the lattice form when it is viewed from a diagonal direction. Therefore, the circuit patterns be designed by so selecting the lands for drawing the circuit patterns that they are diagonally arranged based upon the land pitch, land diameter, pattern width, and space between patterns in the lattice arrangement as viewed from a diagonal direction. Thus, the present invention can be applied to either the land arrangement of the form of a normal lattice or the land arrangement of a staggered form.

EXAMPLE

FIGS. 12 to 18 illustrate an arrangement of circuit patterns in a multi-layer circuit board for mounting an electronic part having 40×40 pins (electrodes) arranged in the form of a normal lattice under the following conditions.

Land pitch: 350 μm

Land diameter: 120 μm

Pattern width: 50 μm

Space between patterns: 50 μm

Under these conditions, a=1 and if n=5, then, k=a(n−1)+(n−2)=2n−3=7 m={350×(5−1)−120−50]/(50+50)=12.3

The above conditions satisfy the requirement m≧k+1. FIGS. 12 to 18 illustrate a case of designing circuit patterns when n=5.

FIGS. 12 to 18 illustrate circuit patterns on the first to seventh circuit boards. Circuit patterns are drawn from the groups each consisting of a sequence of five land on each circuit board. In this case, the lands at both ends of the group from which the circuit patterns are to be drawn are overlapped one upon the other to arrange the groups. In designing the circuit patterns, the lands at both ends of the group may be overlapped, or the lands at both ends may be neighbored to each other.

In the same group, the circuit patterns are drawn, first, from the outer side and, then, gradually from the inner sides as the order of the circuit board advances. The land region is narrowed as the drawing of the circuit patterns advances.

In this embodiment, seven circuit boards are required for drawing the circuit patterns from every land. However, the lands remain only in a small number on the final seventh circuit board, and the drawing is substantially completed on the sixth layer. A layer that can be commonly used, such as a grounding layer, can be arranged in an empty space on the seventh circuit board.

Comparative Example

FIGS. 19 to 25 illustrate, as a comparative example, the arrangement of circuit patterns on a multi-layer circuit board for mounting an electronic part having 40×40 pins (electrodes) arranged in the form of a normal lattice. The conditions such as land pitch, etc. are the same as those of the above-mentioned Example, and circuit patterns are drawn from the groups each consisting of five lands.

In this Comparative Example, too, seven circuit boards are required for drawing the circuit patterns from every land.

According to the method of this Comparative Example, the circuit patterns are drawn considerably efficiently. As will be understood from the number of lands remaining on the seventh circuit board, however, the efficiency for drawing the circuit patterns is inferior to that of the above-mentioned Example.

It will be understood that the method of designing the circuit patterns of the above Example makes it possible to very highly efficiently draw the circuit patterns compared with that of Comparative Example.

As described above, the multi-layer circuit board according to the present invention makes it possible to very efficiently draw the circuit patterns from the region on where the lands are arranged. It is therefore allowed to decrease the number of the circuit boards constituting the multi-layer circuit board, to increase the production yield of the multi-layer circuit board, and to provide a highly reliable multi-layer circuit board.

What is claimed is:

1. A multi-layer circuit board formed by laminating a plurality of circuit boards each having lands arranged in many number in the form of a lattice or in a staggered manner on the side of a mounting surface and having circuit patterns with one ends being connected to said lands and the other ends being drawn toward the outside from a region where said lands are arranged; wherein the lands for drawing the circuit patterns in a number of not smaller than a+1 are arranged on the oblique lines of an isosceles triangle having a base formed by consecutive lands of a number of n and having oblique lines in the diagonal directions, the value n satisfying m=k+1 of the two values of:

$$m\{(\text{land pitch}) \times (n-1) - (\text{land diameter}) - (\text{space between patterns})\} \div (\text{pattern width} + \text{space between patterns}),$$

$$k = a(n-1) + (n-2),$$

wherein "a" is the number of the circuit patterns that can be arranged between the neighboring lands on the circuit board, and "n" is a parameter.

2. A multi-layer circuit board as set forth in claim 1, wherein n is an even number, and the lands for drawing the circuit patterns are arranged on a figure approximate to an isosceles triangle having the lands of the number of ((n/2)+1) arranged on one oblique line thereof.

3. A multi-layer circuit board as set forth in claim 2, wherein the circuit patterns are drawn in a number of k+(n−1) or m for the value n.

* * * * *

UNITED STATES PATENT AND TRADEMARK OFFICE
CERTIFICATE OF CORRECTION

PATENT NO.  : 6,194,668 B1
DATED       : February 27, 2001
INVENTOR(S) : Michio HORIUCHI, Yukihara TAKEUCHI, Eiji YODA It is certified that error appears in the above-identified patent and that said Letters Patent is hereby corrected as shown below:

Claim 1, line 13, replace "$m=k+1$" with --$m \geq k+1$--.

Signed and Sealed this

Fifth Day of June, 2001

*Attest:*

*Attesting Officer*

NICHOLAS P. GODICI

*Acting Director of the United States Patent and Trademark Office*